US011264991B2

(12) United States Patent
Lukefahr et al.

(10) Patent No.: US 11,264,991 B2
(45) Date of Patent: Mar. 1, 2022

(54) FIELD-PROGRAMMABLE GATE ARRAY WITH UPDATABLE SECURITY SCHEMES

(71) Applicants: The Trustees of Indiana University, Indianapolis, IN (US); The United States of America, as represented by the Secretary of the Navy, Arlington, VA (US)

(72) Inventors: Andrew Lukefahr, Bloomington, IN (US); Adam Duncan, Bloomington, IN (US)

(*) Notice: Subject to any disclaimer, the term of this patent is extended or adjusted under 35 U.S.C. 154(b) by 0 days.

(21) Appl. No.: 17/104,648

(22) Filed: Nov. 25, 2020

(65) Prior Publication Data

US 2021/0159902 A1    May 27, 2021

Related U.S. Application Data

(60) Provisional application No. 62/940,313, filed on Nov. 26, 2019.

(51) Int. Cl.
*H03K 19/173* (2006.01)
*H03K 19/1776* (2020.01)
*H03K 19/17704* (2020.01)
*H03K 19/17728* (2020.01)

(52) U.S. Cl.
CPC ... *H03K 19/1776* (2013.01); *H03K 19/17708* (2013.01); *H03K 19/17728* (2013.01)

(58) Field of Classification Search
CPC ....... H03K 19/17708; H03K 19/17728; H03K 19/1776
See application file for complete search history.

(56) References Cited

U.S. PATENT DOCUMENTS

| | | | |
|---|---|---|---|
| 9,165,631 B2 | 10/2015 | Kim et al. | |
| 9,256,881 B2* | 2/2016 | Engels | G06Q 10/087 |
| 9,614,144 B1 | 4/2017 | Annunziata et al. | |
| 10,699,764 B1 | 6/2020 | Roy et al. | |
| 10,740,466 B1* | 8/2020 | Bshara | G06F 21/71 |
| 2018/0096154 A1* | 4/2018 | Shivanna | G06F 21/577 |
| 2019/0348986 A1 | 11/2019 | Kay et al. | |
| 2020/0127665 A1* | 4/2020 | Zhang | H03K 19/17728 |
| 2021/0012073 A1* | 1/2021 | Suko | G06K 19/07745 |

FOREIGN PATENT DOCUMENTS

WO        2012/018918       2/2012

* cited by examiner

*Primary Examiner* — Kurtis R Bahr
(74) *Attorney, Agent, or Firm* — Faegre Drinker Biddle & Reath LLP

(57) ABSTRACT

A field-programmable gate array (FPGA) architecture capable of performing immutable hardware Root-of-Trust updates and patches. In embodiments, the architecture utilizes the dielectric breakdown mechanism of magneto tunnel junctions (MTJ) to operate both as: 1) multi-time programmable (MTP) configuration memory for reconfigurable FPGA designs, and 2) one-time programmable (OTP) memory for FPGA Root-of-Trust sections.

24 Claims, 10 Drawing Sheets

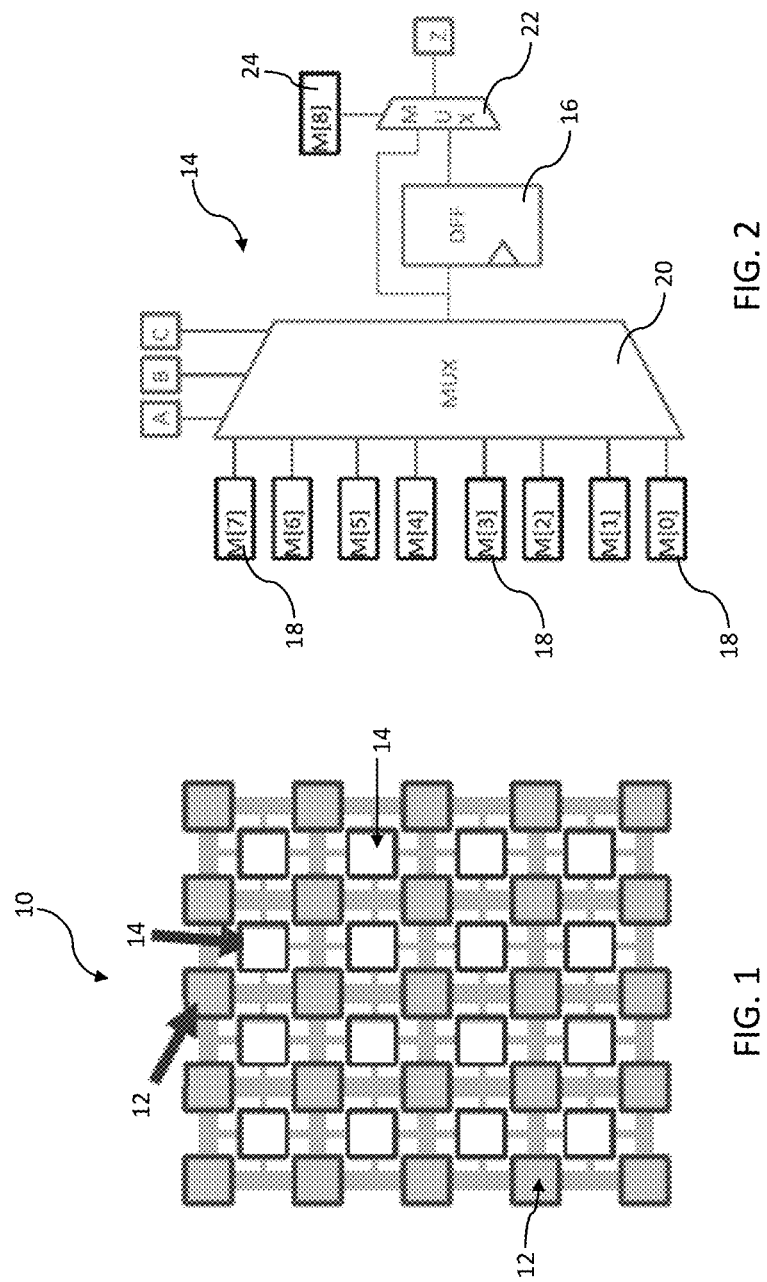

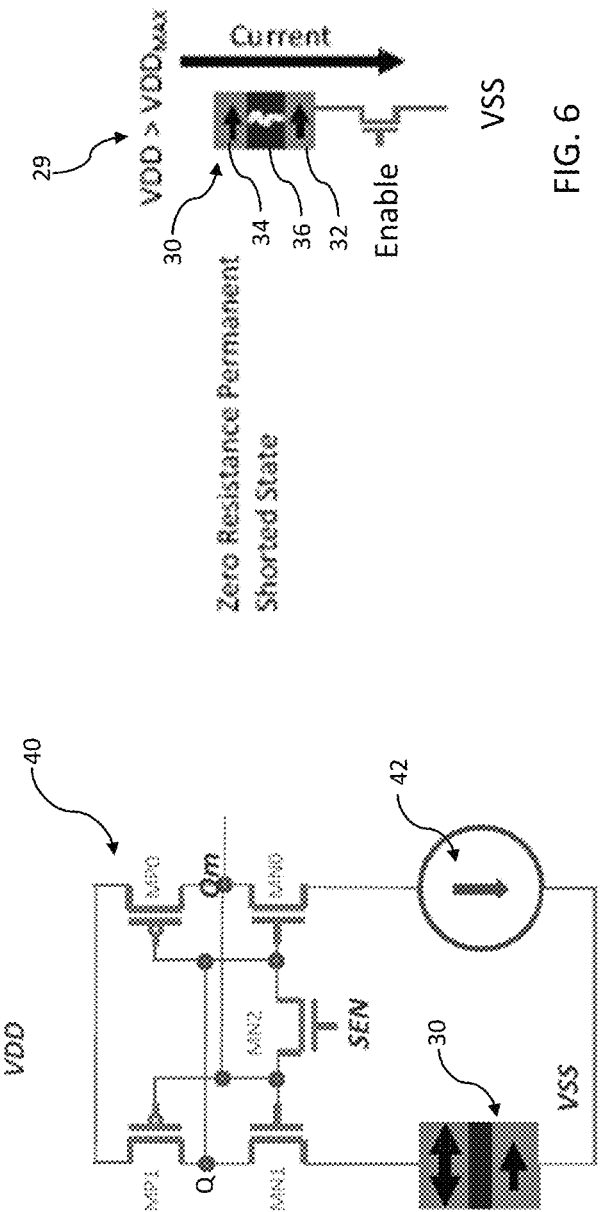

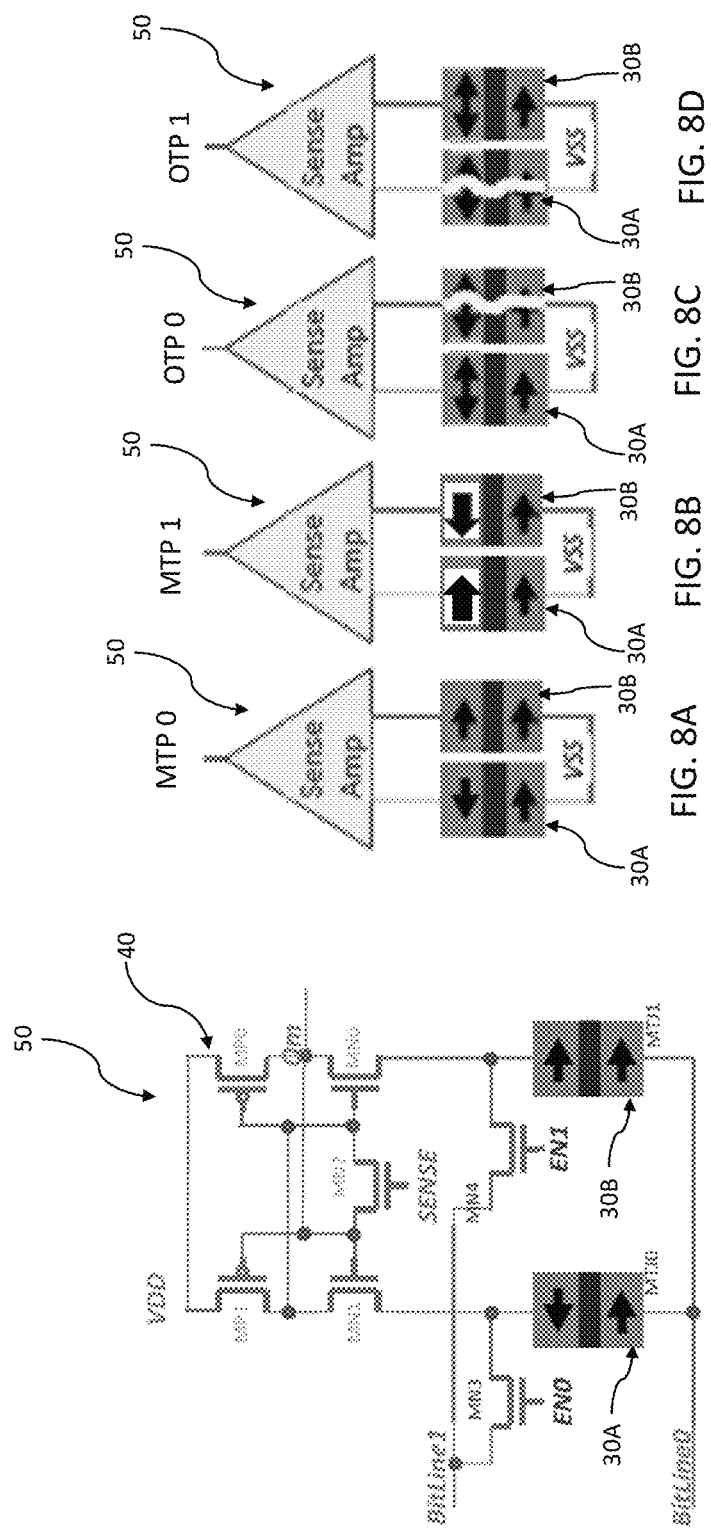

| Value | MTJ | State | BitLine1 | BitLine0 | MN3 | MN4 |
|---|---|---|---|---|---|---|
| MTP 0 | MTJ0 | Anti-Parallel | $V_{SS}$ | $V_{WRITE}$ | ON | OFF |
| | MTJ1 | Parallel | $V_{WRITE}$ | $V_{SS}$ | OFF | ON |
| MTP 1 | MTJ0 | Parallel | $V_{WRITE}$ | $V_{SS}$ | ON | OFF |
| | MTJ1 | Anti-Parallel | $V_{SS}$ | $V_{WRITE}$ | OFF | ON |
| OTP 0 | MTJ1 | Breakdown | $V_{BLOW}$ | $V_{SS}$ | OFF | ON |
| OTP 1 | MTJ0 | Breakdown | $V_{BLOW}$ | $V_{SS}$ | ON | OFF |
| Read | - | - | $V_{SS}$ | $V_{SS}$ | OFF | OFF |

FIG. 9

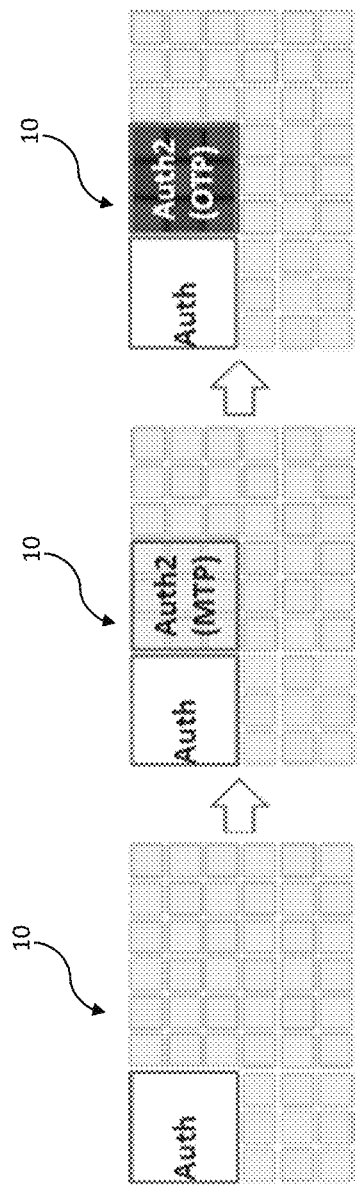
FIG. 13A
FIG. 13B
FIG. 13C
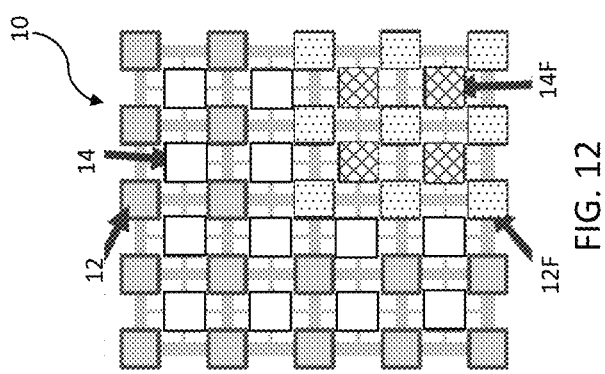
FIG. 12

| Security Primitive | LUTs | FFs | Mid-grade MOCS Resources | High-grade MOCS Resources |
|---|---|---|---|---|
| SHA-1 | 1022 | 1023 | 0.86 % | 0.05 % |
| SHA-256 | 754 | 1813 | 1.52 % | 0.08 % |
| SHA-3 | 3053 | 3053 | 2.55 % | 0.13 % |
| AES-256 | 2246 | 3481 | 2.91 % | 0.15 % |

FIG. 14

FIELD-PROGRAMMABLE GATE ARRAY WITH UPDATABLE SECURITY SCHEMES

REFERENCE TO RELATED APPLICATION

This application claims the benefit of U.S. Provisional Patent Application Ser. No. 62/940,313, filed on Nov. 26, 2019 and entitled Magnetic Tunnel Junction Devices (MTJs), Field Programmable Gate Arrays Including The MTJs, And Related Methods, which is incorporated herein by reference in its entirety for all purposes.

FIELD

This disclosure relates generally to field-programmable gate arrays (FPGAs) including memory bitcells capable of operating in a multi-time-programmable mode and a one-time-programmable mode. Disclosed embodiments include operating such an FPGA to store updatable security schemes.

BACKGROUND

Field-Programmable Gate Arrays (FPGAs) are integrated circuits capable of being configured to implement a wide range of digital logic functionality. Logic elements in the FPGA are configured to provide the desired logic functionality by the application of an external bitstream or binary configuration file. An advantage of FPGAs is that their logic functionality can be updated.

FPGAs may also incorporate a Root-of-Trust containing for example encryption and/or authentication scheme functionality. To prevent loading of malicious or otherwise tampered-with bitstreams, the incoming bitstreams for the desired logic functionality may be processed by the Root-of-Trust before being used to configure the FPGA. The incoming bitstreams may therefore be verified to prevent unauthorized bitstream access.

However, the Root-of-Trust may also be vulnerable. If the Root-of-Trust on the FPGA is compromised, it may not be possible to prevent malicious or otherwise tampered-with bitstreams from being loaded onto the FPGA (e.g., during updates). For similar reasons, it may not be possible to update or "patch" the Root-of-Trust. The only solution to a compromised Root-of-Trust may be to physically replace the FPGA.

There remains, therefore, a continuing need for improved FPGAs and methods of use. An FPGA and method that enables updatable or patchable Roots-of-Trust would be especially advantageous.

SUMMARY

Disclosed embodiments include FPGAs and related methods that enable updatable Roots-of-Trust.

One example is a method for manufacturing and/or operating a field programmable gate array (FPGA) including programmable blocks (PBs), wherein the PBs include memory bitcells operable in a multi-time-programmable (MTP) mode and a one-time-programmable (OTP) mode, comprising: (1) configuring the FPGA to perform a first Root-of-Trust (ROT) scheme utilizing first dedicated built-in circuitry and/or by configuring memory bitcells of a first group of PBs to operate in the OTP mode; (2) receiving a first functional bitstream representative of a first functional operation for the FPGA; (3) performing the first ROT scheme on the first functional bitstream using the first dedicated built-in circuitry and/or the memory bitcells of the first group of PBs; (4) controlling the memory bitcells of a second group of PBs in the MTP mode to configure the memory bitcells of the second group of PBs for the first functional operation based on the first functional bitstream after performing the first ROT scheme on the first functional bitstream, wherein the memory bitcells of the second group of PBs is different than the first group of PBs; (5) receiving a first update ROT bitstream representative of a first updated ROT scheme; and (6) controlling the memory bitcells of a third group of PBs in the OTP mode to configure the memory bitcells of the third group of PBs to perform the first updated ROT scheme based on the first update ROT bitstream, wherein at least some of the memory bitcells of the third group of PBs is different than the memory bitcells of the first group of PBs.

In any of the examples above, configuring the memory bitcells of the first group of PBs may comprise: (1) receiving a first ROT bitstream representative of the first ROT scheme; and (2) controlling the memory bitcells of the first group of PBs in the OTP mode to configure the memory bitcells of the first group of PBs to perform the first ROT scheme.

In any or all of the examples above, the method may further comprise: (1) receiving a second functional bitstream representative of a second functional operation for the FPGA; (2) performing the first updated ROT scheme on the second functional bitstream using the memory bitcells of the third group of PBs; and (3) controlling the memory bitcells of a fourth group of PBs in the MTP mode to configure the memory bitcells of the fourth group of PBs for the second functional operation based on the second functional bitstream.

In any or all of the examples above, at least some of the memory bitcells of the fourth group of PBs are different than the memory bitcells of the second group of memory bitcells. In any or all of the examples above, at least some of the memory bitcells of the fourth group of PBs are the same as the memory bitcells of the second group of memory bitcells.

In any or all of the examples above, the method may further comprise: (1) receiving a second update ROT bitstream representative of a second updated ROT scheme; (2) controlling the memory bitcells of a fifth group of PBs in the OTP mode to configure the memory bitcells of the fifth group of PBs to perform the second updated security scheme based on the second ROT bitstream, wherein at least some of the memory bitcells of the fifth group of PBs is different than the memory bitcells of the first and third groups of PBs; (3) receiving a third functional bitstream representative of a third functional operation for the FPGA; (4) performing the second updated security scheme on the third functional bitstream using the memory bitcells of the fifth group of PBs; and (5) controlling the memory bitcells of a sixth group of PBs in the MTP mode to configure the memory bitcells of the sixth group of PBs for the third functional operation after performing the second updated security scheme on the third functional bitstream.

In any or all of the examples above, at least some of the memory bitcells of the sixth group of PBs are different than the memory bitcells of the second group of memory bitcells. In any or all of the examples above, at least some of the memory bitcells of the sixth group of PBs are the same as the memory bitcells of the second group of memory bitcells.

In any or all of the examples above, the ROT scheme comprises one or more of an authentication scheme, a verification scheme, an encryption scheme, or a decryption scheme.

In any or all of the examples above, the FPGA comprises one or both of configurable logic blocks or configurable interconnects.

In any or all the examples above, the memory bitcells comprise magnetic tunnel junction bitcells.

BRIEF DESCRIPTION OF THE DRAWINGS

FIG. 1 is a diagrammatic illustration of a field-programmable gate array (FPGA) in accordance with embodiments.

FIG. 2 is a diagrammatic illustration of a simplified configurable logic block (CLB) in accordance with embodiments.

FIG. 5 is a diagrammatic illustration of a current sense amplifier in accordance with embodiments.

FIG. 6 is a diagrammatic illustration of a magnetic tunnel junction (MTJ) memory cell in a zero resistance, permanent shorted state, in accordance with embodiments.

FIG. 7 is a diagrammatic illustration of a memory bitcell in accordance with embodiments.

FIGS. 8A-8D are diagrammatic illustrations of memory bitcells with MTJs in multiple-time-programmable (MTP) logic 0, MTP logic 1, one-time-programmable (OTP) logic 0 and OTP logic 1 mode states, respectively, in accordance with embodiments.

FIG. 9 is a table listing write sequences for the memory bitcells, in accordance with embodiments.

FIG. 12 is a diagrammatic illustration of an FPGA in accordance with embodiments, with some of the CLBs and CIs in fixed or OTP mode states.

FIGS. 13A-13C are diagrammatic illustrations of an FPGA during a sequence of steps by which the FPGA is programmed with Roots-of-Trust (ROT) and updated ROT in accordance with embodiments.

FIG. 14 is a table listing exemplary resource utilizations in accordance with embodiments.

DETAILED DESCRIPTION

Figure 4B:
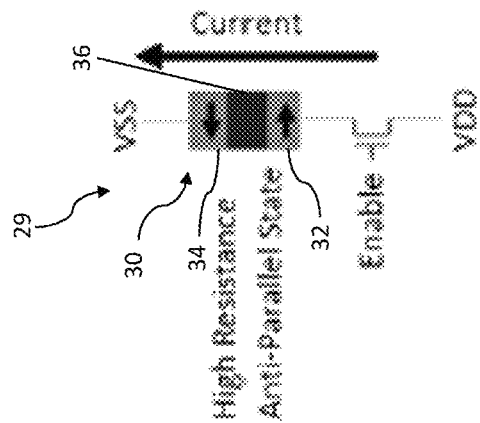
FIGS. 4A and 4B are diagrammatic illustrations of magnetic tunnel junction (MTJ) memory cells in a low resistance state and a high resistance state, respectively, in accordance with embodiments.

FIG. 1 is a diagrammatic illustration of a simplified field-programmable gate array (FPGA) 10 in accordance with embodiments. The FPGA 10 is an integrated circuit that is based around a matrix of reconfigurable blocks or "Gate Array." These blocks can be configured, or reconfigured, by the user post-manufacturing, yielding the "Field-Programmable." The basic architecture includes multiple configurable interconnects (CIs) 12 and configurable logic blocks (CLBs) 14. CLBs 14 utilize internal memory elements to implement a simple combinational or sequential logic function. In CLBs 14, reconfigurable memory elements are used to define the logical truth table of the circuit, and add state using an optional D flip flop (DFF) 16 (FIG. 2). When logic designs exceed the capacity of a single CLB 14, CIs 12 are used to connect multiple CLBs together to achieve the required circuit. CIs 12 may include a complex network of wires and routing junctions that allow the output of one CLB 14 to be connected as the input of one or more CLBs.

FIG. 2 is a diagrammatic illustration of a simplified CLB 14. The CLB 14 provides an arbitrary combinational logic capability coupled with a DFF 16 to add simple sequential logic options. Here the CLB 14 is composed of multiple memory elements 18, denoted as M[0] M[8], a 8-input multiplexer 20, a DFF 16, and a 2-input multiplexer 22. The inputs A, B, and C to the multiplexer 20 select which memory cell's binary value is routed through the multiplexer 20. For example, the boolean equation A & B & C may be implemented by setting M[7:0]=1000 0000. Then only A=1, B=1, C=1 will activate M[7] yielding a multiplexer 20 output of 1, while all other input combinations yield a multiplexer 20 output of 0. The final CLB 14 output, Z, is controlled by the secondary 2-input multiplexer 22 that selects either the output of the 8-input multiplexer 20 or the DFF 16. The embodiment shown in FIG. 2 includes an additional memory cell 24, M[8] is used to select which multiplexer input 20 or 22 is routed as the output Z.

Figure 3:
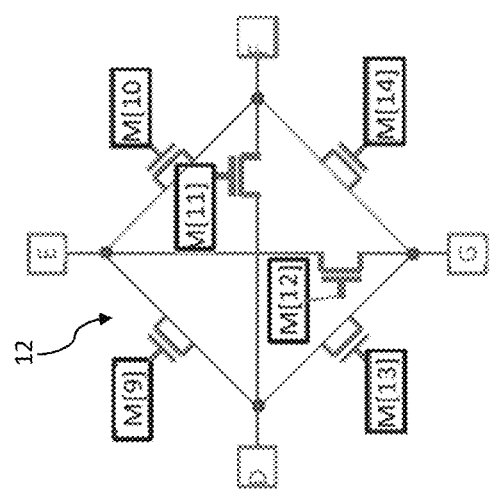
FIG. 3 is a diagrammatic illustration of a simplified configurable interconnect (CI) in accordance with embodiments.

A second component of FPGA 10 is a CI 12. FIG. 3 is a simplified diagrammatic illustration of a CI 12. CI 12 is a cell that routes an input signal on any of the wires, e.g., D, E, F or G, to any of the remaining wires. For example, an input signal on D may be routed to E and G, but not F. The individual enable signals are controlled by memory cells. For example, to route D to E, element M[9] is configured to a logical 1. To disable routing from D to F, element M[11] is configured to logical 0. Multiple routes within CI 12 are also possible, e.g., D to E and G to F can occur simultaneously. While simplified for illustration, FPGA 10 architectures may utilize complex structures of CIs 12 involving arrays of wires and sometimes sparse interconnection points.

The reconfigurable nature of FPGAs 10 may make it difficult to prevent vulnerabilities to Root-of-Trust exploits. Examples of two potential vulnerability vectors, external bit-streams and internal reconfigurations, follow.

External Vulnerabilities: FPGAs that utilize Static Random-Access Memory (SRAM) and Flash cells to implement the memory cells are commercially available. An advantage of SRAM is a relatively higher capacity than Flash. Unfortunately, the capacity of SRAM may come at a cost such as volatility. When power is lost, e.g., unplugged, SRAM-based FPGAs lose all stored binary values. When power is restored, the FPGA must reload the memory's contents from an off-chip bitstream, or binary configuration file. As the bitstream file must be re-read at every powerup, it is usually stored in an off-chip non-volatile memory and its contents encrypted to prevent unauthorized tampering and inspection. At startup, the FPGA loads the bitstream and utilizes an on-chip key, decryption, and authentication scheme to decrypt the bitstream and verify its authenticity before loading the binary values into memory. Thus this encryption/authentication forms an example of FPGA Root-of-Trust.

However, despite sophisticated encryption and authentication protocols, this external bitstream link may be vulnerable to tampering, reverse engineering, and trojan insertion. Once the encryption/authentication scheme is compromised, the FPGAs Root-of-Trust may be vulnerable to external attacks. Effective methods for 'patching' a vulnerable Root-of-Trust with SRAM-based systems are not generally available. If additional Root-of-Trust features are added to a volatile FPGA through the reconfigurable bitstream, an adversary may need only to power cycle the FPGA. Upon reboot, all bitstream-based memory values may be lost, including added security features, forcing the FPGA to revert back to the original, vulnerable, Root-of-Trust. Non-volatile Root-of-Trust updates that cannot be reversed by an attacker would be advantageous.

Internal Vulnerabilities: Securing external bit-streams alone may be insufficient. Known FPGA architectures may also allow internal configuration. By an approach or concept similar to self-modifying software code, FPGAs may allow the design to modify itself through an internal configuration port, e.g., the Internal Configuration Access Port (ICAP) for Xilinx devices or Partial Reconfiguration (PR) block by Intel devices. Internal reconfiguration allows the FPGA device to completely replace functional parts of the design with completely different logic while the remainder of the design continues to operate normally. Internal reconfiguration is often utilized for System-on-Chip (SoC) designs where multiple user-level applications may wish to share access to a limited amount of reconfigurable FPGA resources.

Although not the intended use, this internal reconfiguration may open another channel for unauthorized FPGA reconfiguration. In this situation a small vulnerability in the FPGA design may allow an adversary to gain control of reconfiguration, and utilize reconfiguration to dynamically inspect the design or load malicious designs. This is particularly true for SoC systems, where untrusted designs dynamically loaded by software may attempt to gain control of internal reconfiguration. Thus the FPGA preferably does not allow an internal path to circumvent the FPGAs Root-of-Trust.

Root-of-Trust Hardening: Significant security challenges may be involved when implementing an update mechanism for FPGA Root-of-Trust updates. Such update mechanisms are preferably resilient to both external and internal attacks. External attacks may be easier to defend. For external attackers, the FPGA Root-of-Trust may be essentially a "black box", where either an incoming bitstream is accepted or rejected. The internal details of the Root-of-Trust may not be directly visible to an external attacker.

However, for internal attackers who may have access to internal reconfiguration, the Root-of-Trust is potentially observable. As updates to the Root-of-Trust may utilize the same internal reconfiguration port, it is advantageous to ensure that gaining access to internal reconfiguration does not compromise the Root-of-Trust. It is also advantageous to ensure that even if Root-of-Trust updates are observable, they are un-modifiable. A desirable method to achieve this capacity is through physical modifications to the Root-of-Trust in the form of One-Time-Programable (OTP) memories.

A Root-of-Trust memory is preferably Read-Only Memory (ROM). ROMs provide read access to the memory, but lack the physical circuitry to update the values. For Root-of-Trust updates, the ability to write new configuration values once can be utilized. One-Time-Programable (OTP) memories allow a single write operation after which they become a ROM. For integrated circuits, these may be implemented as antifuses. Similar in concept to a fuse, when excessive current flows through an antifuse, it will breakdown. Unlike a fuse, which is designed to breakdown to an open circuit, antifuses breakdown to a shorted circuit. Thus, values may be encoded through whether or not the antifuse has experienced a breakdown.

The FPGA 10 of FIG. 1 may be extended with additional OTP space for Root-of-Trust updates. This would allow Root-of-Trust updates to be written once but not modified or rolled back. However, a challenge is determining the size of this OTP space. If this OTP space is to be fixed at manufacture time, the FPGA 10 would preferably incorporate sufficient OTP space to handle all future Root-of-Trust updates. Failure to incorporate sufficient space might prevent some future updates. However, that OTP space may be displacing reconfigurable logic space, e.g., the design space of the FPGA 10. Thus the manufacturer may be faced with a tradeoff between incorporating sufficient OTP space for all future Root-of-Trust updates, while minimizing the loss of reconfigurable logic space.

Embodiments disclosed herein include the capability to convert otherwise reconfigurable logic space to OTP space when required for Root-of-Trust updates. This dynamic conversion may provide a major impact in FPGA 10 technologies.

Magnetic Tunnel Junctions (MTJs) cells can provide a non-volatile memory technology that can match or exceed the densities of SRAM. MTJs may offer non-volatile data retention in excess of 10 years, even in adverse conditions. A single MTJ and access transistor (1T1MTJ) may require 0.0484=2 in Intel's 22FFL process compared to SRAM's 0.084=2 in the same process. This may allow MTJs to offer the density of SRAM with non-volatility.

Figure 4A:
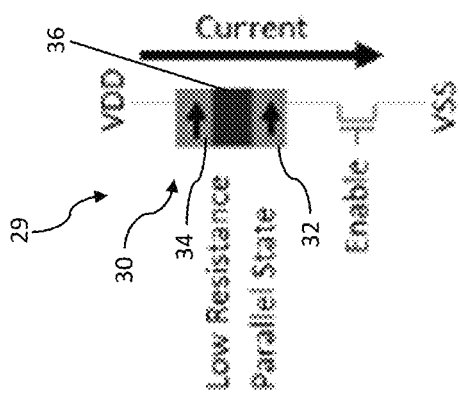

FIGS. 4A and 4B are diagrammatic illustrations of a cell 29 including MTJ 30. MTJs 30 store a resistance through the variance in two magnetic fields. The MTJ 30 includes three different layers. The pinned layer 32 has a fixed magnetization. The magnetization of the free layer 34 can be changed with current flow and direction within the MTJ cell 29. A thin film of tunnel oxide 36 serves as a dielectric insulator between the layers 32 and 34, forcing electrons to tunnel between the two ferromagnetic layers.

As shown in FIG. 4A, when sufficient current flows through the MTJ cell 29 in one direction (shown as flowing downward), the magnetic field of the free layer 34 will begin to align with that of the pinned layer 32, entering a parallel state. This has the effect of reducing the overall resistance of the MTJ 30 and cell 29. When the current flow is reversed as shown in FIG. 4B, the magnetic field of the free layer 34 will again change, this time entering the anti-parallel state, causing an increased overall resistance of the MTJ 30 and cell.

FIG. 5 is a diagrammatic illustration of a current sense amplifier or sense amp 40 including a MTJ 30 in accordance with embodiments. Unlike SRAM, MTJ cells 29 may be characterized not as storing binary values, but rather as encoding stored information through either the parallel (low resistance) or anti-parallel (high resistance) states. MTJ cells 29 may be characterized as a magnetoresistive random-access memory (MRAM) cell, and the MTJ-based digital-logic equivalent of SRAM, including two additional components: the current sense amplifier 40 circuit and a reference current 42. The sense amp 40 may be used to compare two currents and produce a digital value indicating which is greater. To read the value, element MN2 is enabled through a SENSE signal, causing the sense amp 40 to enter a metastable state. Once element MN2 is disabled, both signals Q and Qm will begin drifting apart, depending on the current flow through the elements MN1 and MN0.

When the MTJ 30 is in a high-resistance anti-parallel state, this causes a low current flow through the MTJ. When the MTJ 30 is in a low-resistance parallel state, a higher current flows. The reference current 42 provides an intermediate current between the high and low current levels of the MTJ 30. Over time this current flow will gradually turn off either element MN1 or MN0, and drive a digital-logic value on Qm. If the current flow through the MTJ 30 is higher than the reference, e.g., the MTJ is in a low-resistance parallel state, Qm will gradually become a logical 1. If the MTJ 30 is in a high-resistance anti-parallel state, the current flow will be less than the reference, and Qm will gradually become a logical 0. Thus, the circuit shown in FIG. 5 digitizes the value encoded as a magnetic resistance stored in an MTJ 30.

MTJs 30 contain an insulating tunnel oxide layer 36 through which electrons tunnel between magnetic layers. However, it has been observed that if excessive voltage is applied across the MTJ 30, it will result in the oxide layer 36 breakdown resulting in a low-resistance path (short) between the two magnetic layers 32 and 34. A diagrammatic illustration of this process is shown in FIG. 6. As this breakdown is irreversible, once an MTJ 30 has experienced a dielectric breakdown, it is physically shorted and can no longer be used to retain a value through resistance.

Dielectric breakdown can be used to store OTP values by deliberately causing breakdown on only some of the MTJ cells 29. MTJs 30 that have experienced dielectric breakdown have a small resistance, e.g. 10Ω. However, MTJs 30 that have not suffered breakdown still retain their original resistance, e.g. 5 KΩ for parallel and 10 KΩ for anti-parallel.

Sense amp circuits 40 such as those shown in FIG. 5 may be used with a different reference current to determine if the MTJ cell 29 has a low (e.g., 10Ω) or high (e.g., 5 KΩ) resistance, and digitize that output as a 0 or 1. Thus, it is possible to utilize MTJ cells 29 to create an OTP memory.

Disclosed embodiments allow the same MTJ memory cells to be used for both multi-time-programmable (MTP) and OTP modes. Conversions from MTP to OTP modes may be provided, while preventing any transitions from OTP back to MTP mode. Reconfigurability is supported within MTP mode to realize user designs, while immutability is the primary feature of the OTP mode and is used to facilitate Root-of-Trust updates.

FIG. 7 is a diagrammatic illustration of a memory bitcell 50 that can be used for MTP-to-OTP Conversion for Security (MOCS) architecture disclosed herein. Bitcell 50 contains two opposing MTJs 30 in the illustrated embodiment and are shown yielding a logical 0. MOCS enables the same FPGA 10 to operate in either MTP or OTP mode, as well as the hybrid of the two. The illustrated embodiment of bitcell 50 incorporates two MTJs 30, while retaining the sense amp 40 circuit (FIG. 5). The additional MTJ 30 can directly replace the reference current (42 in FIG. 5). However, the two MTJs 30 are configured in opposing polarity states. This is shown in FIG. 7 with MTJ 30A in an anti-parallel state and MTJ 30B in the parallel state. The opposing polarity magnifies the differences in current available to the sense amp 40, e.g., doubling that of the embodiment shown in FIG. 5. This higher margin for the sense amp 40 yields more robust discrimination between logical values, and may provide advantages for some application domains, e.g., high-temperature or high-radiation environments.

FIGS. 8A-8D are diagrammatic illustrations of memory bitcells 50 showing the states of the MTJs 30A and 30B for the logical MTP 0, MTP 1, OTP 0 and OTP 1, respectfully. As indicated by FIG. 8A, for a logical 0, the MTJs 30A, 30B are configured as anti-parallel (MTJ 30A) and parallel (MTJ 30B). As indicated by FIG. 8B, a logical 1 reverses this with MTJ 30A in a parallel and MTJ 30B in an anti-parallel state. For OTP mode, logical 0s are created by causing breakdown to MTJ 30B, while logical 1s are created by causing breakdown to MTJ 30A, as indicated by FIGS. 8C and 8D, respectively. The configuration of the unbroken MTJ 30A or 30B (parallel or anti-parallel) does not affect the logical output in the OTP modes. Thus both logical 0s and logical 1s in the OTP modes may rely on breakdown of a single MTJ. As MTJs such as 30A and 30B are implemented physically above the transistors in the bitcells 50 in the manufacturing process, a two MTJ cell 29 design may have negligible impact on overall cell area vs. a one MTJ cell (not shown). The transistors included in the bitcell 50 are driven by the sense amp 40 in the illustrated embodiments. While 2D memory arrays can multiplex sense amps such as 40 for an entire column of memory cells, FPGAs such as 10 may benefit from constant access to every cell. Thus they preferably utilize a 1D array, i.e., one bitcell such as 50 per column, with a sense amp for each bit. Thus, the five transistors for the sense amp 40 illustrated in FIGS. 5 and 7 (MP0-MP1, MN0-MN2), plus two access transistors (MN3-MN4) may require more area than two MTJs.

FIG. 7 illustrates embodiments of bitcell 50 including two bitline rails BitLine1 and BitLine0. While both BitLine1 and BitLine0 may be used for write operations, for read operations it may be sufficient to set both BitLine1 and BitLine0 to the ground voltage (VSS). The two access transistors MN3 and MN4 are disabled. As before, the sense signal, SENSE, is raised to reset the sense amp 40 into a metastable state. When SENSE is lowered, feedback within the sense amp 40 will cause it to drift toward a logical 0 or logical 1, depending on the difference in resistance values of MTJ 30A and MTJ 30B.

FIG. 9 is a table listing the write sequences for the bitcell 50 shown in FIG. 7. To write MTP values, a two-step process is used to program the two MTJs 30A, 30B into opposite polarities. To write a logical 1, MTJ 30A is in a low-resistance parallel state with MTJ 30B in a high-resistance anti-parallel state. First, BitLine1 is energized to the write voltage (VWRITE) and BitLine0 to VSS. Then the access transistor MN3 is enabled causing a current flow from BitLine1 through MTJ 30A into BitLine0. This current flow programs MTJ 30A into a parallel state. A similar process is repeated for MTJ 30B, excepting BitLine0 is now at VWRITE and BitLine1 is now VSS. Current flows from BitLine0 to BitLine1 when transistor MN4 is enabled, causing MTJ 30B to enter an anti-parallel state. After both steps are complete, e.g., MTJ 30A is parallel and MTJ 30B is anti-parallel, the sense amp 40 may be reinitialized causing Qm to yield a logical 1. Writing a logical 0 to the bitcell 50 follows a similar process, excepting that the ordering of the voltages applied to BitLine1 and BitLine0 are reversed, shown in FIG. 9.

Figure 10:
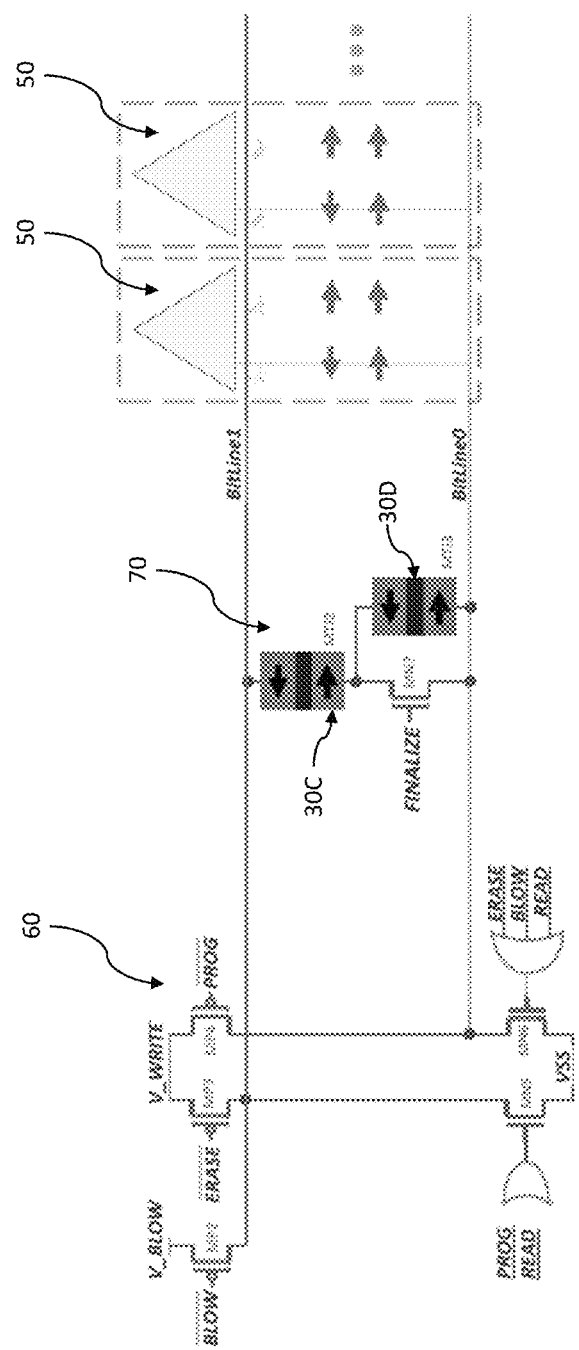
FIG. 10 is a diagrammatic illustration of a circuit for delivering signals to bitline rails of the memory bitcells, in accordance with embodiments.

FIG. 10 is a diagrammatic illustration of a circuit 60 that may be used to deliver the voltages VWRITE and VSS to the BitLine1 and BitLine0 rails of the bitcell 50. The embodiments shown in FIG. 10 are configured as a single circuit used to supply the voltage rails BitLine1 and BitLine0 for multiple bitcells 50 in the FPGA 10. As shown, three primary signals, and their compliments, are used to enable/disable the appropriate voltages on the desired rails. ERASE and ERASE enables transistors MP3 and MN6, setting BitLine1=VWRITE and BitLine0=VSS. PROG and PROG enables transistors MP4 and MN5, setting BitLine1=VSS and BitLine0=VWRITE. READ enables transistors MN5 and MN6, setting both BitLine1 and BitLine0 to VSS. Signal BLOW, BLOW, and FINALIZE are discussed below in connection with OPT Writes of bitcells 50.

As indicated in FIG. 10, the BitLine1 and BitLine0 rails are shared across multiple bitcells in the illustrated embodiments. Coordination between bitcells 50 is provided in these embodiments. The access transistors for the bitline rails may not be able to support the current levels required to program multiple MTJs simultaneously. Bitcells storing logical 1s may use a different bitline sequence than bitcells storing logical 0s. Different optimization techniques may be used for the bitlines and bitcells, provided that all cells are eventually correctly programmed.

For MTP-to-OTP conversion, a voltage sufficiently high to cause dielectric breakdown (VBLOW) is applied to BitLine1 with VSS applied to BitLine0. To write a logical 1, transistor MN3 is enabled causing breakdown to MTJ 30A (e.g., FIG. 7). The resistance of (broken) MTJ 30A is then low, while the resistance of (unbroken) MTJ 30B (e.g., FIG. 7) is high, indicated in FIG. 8D. To write a logical 0, this process is reversed and MN4 is enabled causing breakdown to MTJ 30B, illustrated in FIG. 8C. If both MN2 and MN3 are enabled this will result in both MTJs 30A and 30B experiencing breakdown, yielding non-deterministic values. For bitline generation, signals BLOW and BLOW may be used to generate VBLOW as discussed in OTP Write mode. Unlike MTP mode, during OTP write modes, the voltages on the bitlines BitLine0 to BitLine1 are need not be reversed, only the individual access transistors are enabled.

Figures 11A, 11B, 11C:
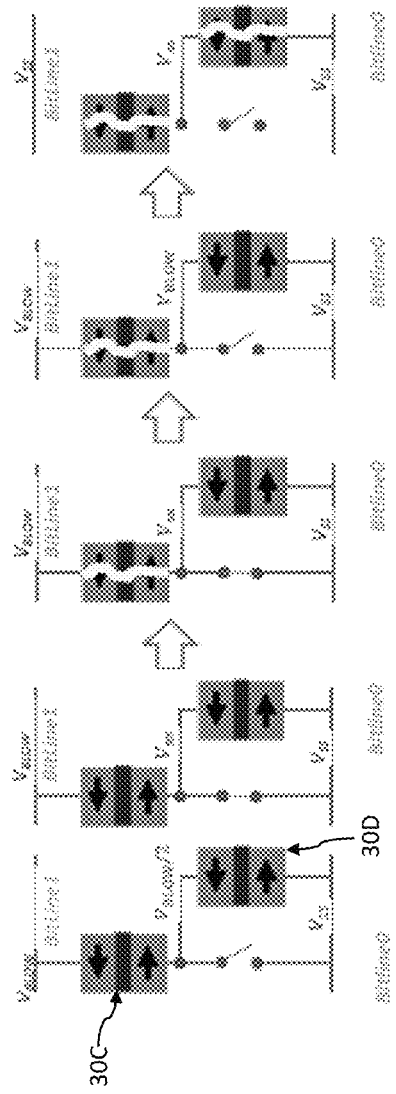
FIGS. 11A-11C diagrammatically illustrate a sequence of steps by which a finalize signal can be applied to the memory bitcells to write OTP mode states, in accordance with embodiments.

FIG. 10 illustrates a finalize circuit 70 to prevent further MTP-to-OTP conversion for a regin of bitcells 50. In the illustrated embodiments, a FINALIZE signal is used to short BitLine1 to BitLine0. Finalize circuit 70 works by utilizing two MTJs 30C and 30D that breakdown to short the two bitlines BitLine1 to BitLine0. FIGS. 11A-11C diagrammatically illustrates a sequence of steps by which the FINALIZE signal can be used to control the finalize circuit 70. As shown by FIG. 11A, for normal MTP operations, FINALIZE is low and MN7 is disabled. When VWRITE or VBLOW is applied between the bitlines, MTJ 30C and MTJ 30D are in series, and thus do not have sufficient voltage drop to experience MTJ breakdown, e.g., they experience a VBLOW/2 voltage drop.

However, when MTP-to-OTP conversion is complete, the finalize sequence shorts the two bitlines. First, as shown by FIG. 11B, FINALIZE is asserted while BitLine1 is held at VBLOW. This activates transistor MN7, bypassing MTJ 30D, and causing MTJ 30C to experience the full VBLOW and experience a breakdown.

Next, as shown in FIG. 11C, transistor MN7 is disabled. The full VBLOW voltage drop is then experienced by MTJ 30D, again causing a breakdown. With both MTJ 30C and MTJ 30D having experienced breakdown, this forms a low-resistance (short) path between the two bitlines BitLine1 to BitLine0, preventing further attempts to program the cells 29.

Memory cells 50 in combination with circuits such as 60 and 70 can be used within FPGA 10. The basic architecture operations may be similar to traditional FPGAs, with the exception of adding non-volatility with the densities of traditional SRAM. This density allows, for example, the entire FPGA 10 configuration (bitstream) to be stored on chip, eliminating the threat of an attacker probing the off-chip bitstream as it is loaded.

As the MTJs 30 store values magnetically, they are resilient to radiation, enabling their use in high-radiation environments. For example, the aerospace and defense market often have strict radiation requirements that include Total Ionizing Dose (TID) and Single-Event Effects (SEE) thresholds. SRAM-based and Flash-based FPGAs, in contrast, may have poor radiation performance.

The MOCS architecture of FPGAs 10 in accordance with embodiments can be operated in either a traditional MTP-only or OTP-only mode. When utilized in MTP-only mode, the FPGAs programming and operation may proceed in a manner similar to traditional FLASH-based systems, e.g., the bitstream is written once and it remains resident until a new bitstream is written. When utilized in OTP-only mode, the FPGA 10 behaves similarly to Antifuse-based FPGAs, e.g., if the bitstream is written once, it cannot be updated.

The fusible nature of the MOCS provides an axis of flexibility for FPGA application developers. An important feature is that each cell 29 can be configured as MTP or OTP independently. FIG. 12 is a diagrammatic illustration of a FPGA 10 where a portion of the CLBs 14 and CIs 12 have been fused and are operating in OTP mode, identified as fixed logic blocks (FLBs) 14F and fixed interconnects (FIs) 12F. As illustrated diagrammatically in the embodiments shown in FIG. 12, the bulk of the resources (e.g., CIs 12 and CLBs 14) are still operating in MTP mode, where they can still be (re)configured.

The MTP-to-OTP conversion process can occur at any one or more of a range of different times. This conversion can, for example, be initiated by or more of the manufacturer, an end-user, or even a middle-ware vendor. As the voltage required to breakdown MTJs such as 30, e.g., 1.8V, is typically available on many FPGA-based systems, MTP-to-OTP conversion can also be done in situ.

Manufacturers may wish to utilize MTP-to-OTP conversion to enable various post-manufacture features. In an application such as this, the FPGA 10 may be manufactured as all-MTP. The manufacturer may then load additional functionality or Intellectual Property (IP) into the FPGA 10, e.g., a 10 Gbps network interface or an Advanced Encryption Standard (AES) core. These may then can then be fixed, preventing the end-user from tampering. Additionally, manufacturers may also incorporate tiered or upgradable features, e.g., multiple levels of features. Although perhaps more complex, a time component can also be integrated, e.g., a vendor may sell an FPGA to a consumer with one year of upgraded security updates, issued by fusing MTJs with a timestamp. The vendor may charge extra to continue support beyond the first year. Another example of a manufacture benefit is utilizing MTP-to-OTP conversion to merge product offerings. Here they may offer two seemingly dissimilar FPGA products, an MTP and an OTP FPGA, which are the same physical implementation. In such a physical implementation the FPGA programming process changes the voltage applied to allow an OTP FPGA from an otherwise MTP.

An end-user may desire MTP-to-OTP conversion of FPGA 10. For example, the user may develop his/her design utilizing the MTP mode, then, upon finalization, utilize OTP mode for mass-production. A designer may utilize OTP mode for some security-critical components, but noncritical components may remain MTP to allow for future feature upgrades. A particularly useful example of upgrading MTP (upgrade security) is discussed below.

Third-party IP vendors today sell their (encrypted) netlist for insertion into end-user FPGAs 10. However, this may leave their functionality or IP vulnerable to, for example, decryption, reverse-engineering, and non-licensed use. Utilizing conversion, the user would physically ship FPGAs such as 10 to the functionality or IP vendor, and the vendor would utilize MTP-to-OTP conversion to program their functionality or IP into a particular section of the FPGA 10 fabric. These post-conversion FPGAs 10 may then be returned to the end user for the remainder of the design in either MTP or OTP mode. This approach may prevent the IP vendor from having to physically disclose its IP, but enables it to irreversibly program IP onto FPGAs 10 in house.

MTJ-based FPGAs 10 may provide significant increases in security compared to other known FPGAs. FPGA security can be simplified down to protecting secrets, such as the FPGA bitstream, from an attacker. Vendors protect these secrets by implementing a Root-of-Trust, such as for example an encryption key used to decrypt a bitstream as the FPGA boots up. This encryption scheme allows for a user to store an encrypted version of the sensitive bitstream outside of the FPGA. Known SRAM-based FPGAs may store the associated encryption key in a battery backed SRAM (BBRAM) cell or in an eFuse array. However, researchers have demonstrated that various techniques may be used to isolate the BBRAM circuitry and extract encryption keys as well as information from the AES decryption circuitry. The security of the eFuse protection is also an issue, as deprocessing of the FPGA layers can expose which fuse lines have been electrically blown.

A benefit of an MTJ-based FPGA 10 is that MTJ 30 density allows for the entire bitstream to be stored on chip, eliminating or reducing the threat of an attacker probing the bitstream as it is loaded onto the FPGA 10. If bitstream readback verification is disabled, then no mechanism exists for extraction of the bitstream from the MTJ. In addition, if encryption is desired to be included within the FPGA vendor design, it can be decoupled from the battery, making the task of finding the MTJs holding the encryption key much more difficult than simply modulating the battery supply pin.

The fusible MTJ-based approach described herein enables a paradigm shift in FPGA security, with a user-upgradable and vendor-upgradable hardware security module (HSM). Vendors currently may include a HSM on their FPGA during the initial IC design with voltage/temperature/glitch tamper detection, as well as encryption and physically unclonable function (PUF) enablement. FPGA 10 can enable vendors to allocate a section of fusible MTJs 30 in their on-chip HSM design that allow for incremental hardware security updates as new hardware security techniques are developed and countermeasures to attacks as they are published. In practice, an update to a device may be issued to the HSM, and then fused so that it cannot be altered, or reverted to a more vulnerable version as when faced with a replay attack. An analogy may be the concept of microcode updates for processors, however, MTJ-enabled logic adds custom hardware and enables for these updates to be sold to users.

A security benefit of in situ MTP-to-OTP conversion provided by FPGAs 10 is the ability to augment authentication schemes in the field. A description of FPGA 10 configuration file (bitstream) updates follows. Bitstreams configure the FPGA 10 to implement the user-specified design by (re)configuring the internal memory values discussed previously.

Securely configuring an FPGA is a problem that has plagued designers for decades. Vendors have attempted to solve this problem by adding encryption and authentication schemes, such as hashed message authentication codes (HMAC). Illustrated in FIG. 13A, these authentication schemes work by computing a hash over the bitstream's bits before allowing loading the bitstream's values into the CLBs and interconnects. If the authentication fails, the bitstream is rejected. Unfortunately these authentication schemes may be compromised within the expected lifetime of an FPGA device. For example, vulnerabilities for Xilinx's 7-series devices were published six years after product introduction. For other and possibly more current devices, e.g., Ultrascale FPGAs, the window of authentication security decreased to only ~4 years.

Once the authentication scheme has been compromised, the FPGA is vulnerable to bitstream tampering and extraction efforts. Preferably, a compromised authentication scheme would be replaced with an upgraded scheme as quickly as possible. Unfortunately this may require physically replacing the FPGA, a solution untenable in many situations. A secondary approach to a compromised authentication scheme is to layer an additional authentication scheme over the first. For FPGAs, this can be accomplished by repurposing some of the configurable logic area to implement the secondary authentication scheme.

Unfortunately this may be an easily-bypassable solution for some FPGAs. It can, for example, be circumvented in volatile SRAM-based FPGAs simply by power-cycling the device, causing it to revert to the original authentication scheme. FLASH-based devices are nonvolatile, but are still vulnerable to a complete reprogramming of the device. OTP antifuse-based devices do not support the additional programming required for a secondary scheme.

However, MOCS including FPGAs 10 described herein offer a method for adding incremental authentication schemes that are not subject to trivial bypass techniques. Illustrated in FIGS. 13B and 13C, this method begins with loading a new authentication scheme, here called 'Auth2' into the FPGA 10 configurable logic space in MTP mode. This step may be similar to Flash-based FPGAs. However, the unique ability of FPGA 10 to convert MTP memory into OTP memory to convert the MTP Auth2 block into an OTP Auth2 block can be leveraged. Once this process is complete, the Auth2 block cannot be unprogrammed. Setting a few additional OTP bits within the FPGA 10 (e.g., as described below) enables the newly added Auth2 block to the authentication scheme, yielding the scheme of FIG. 13C. If desired, this process can be repeated for additional authentication schemes, e.g., an Auth3 can also be added if needed.

Figure 15:
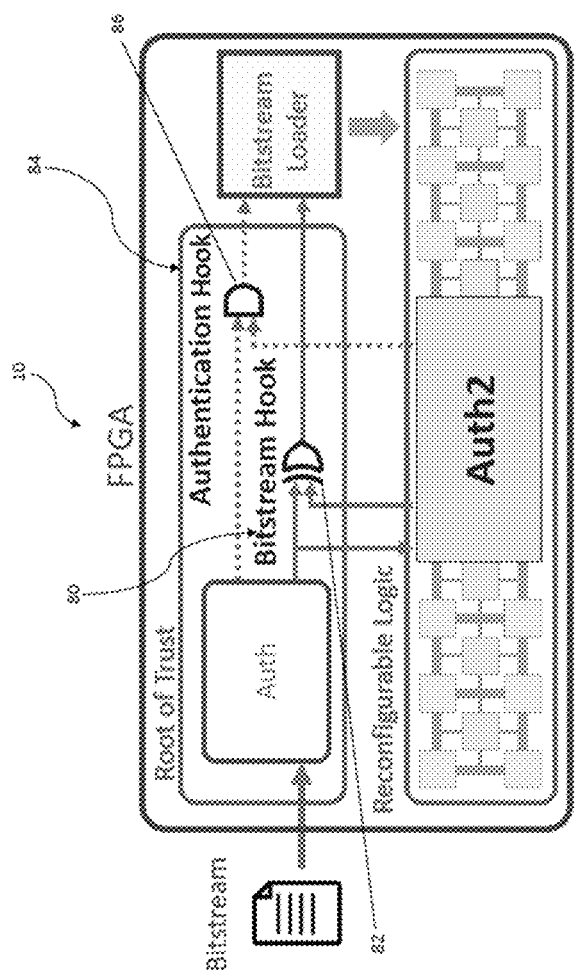
FIG. 15 is a diagrammatic illustration of the Root-of-Trust update capabilities utilizing internal "hook" functionality, in accordance with embodiments.

Once a secondary or update trust scheme, e.g., AUTH2 of FIG. 13B, is immutably deployed onto the FPGA 10, the existing Root-of-Trust in the FPGA 10 may be extended to include the secondary or update trust scheme. For example, the Root-of-Trust scheme may extended with mechanisms that allow the Root-of-Trust to dynamically capture additional bitstream modification and authentication steps, e.g., referred to as "hooks" for this example embodiment. The hooks may enable additional security verification on incoming bitstreams before accepting them. The hooks are illustrated conceptually as logic gates in FIG. 15. The bitstream hook 80, illustrated as including an XOR gate 82 for purposes of description, enables Auth2 to further parse and modify the resulting bitstream, e.g., by passing it through additional cryptographic ciphers. An authentication hook 84, illustrated as including an AND gate 86 for purposes of description, allows Auth2 to add additional verification before the bitstream is accepted. OTP memory cell bits are used to enable the additional hooks within the Root-of-Trust.

As examples, several open source authentication and encryption verilog modules were synthesized to estimate the possible resource utilization for a MOCS Root-of-Trust update. An MTJ-based FPGA fabricated in an Intel 22FFL where the 1T1MTJ circuit area is 1.8× larger than an equivalent SRAM cell as discussed above was assumed. Estimates targeted a mid-grade Xilinx Artix-7 7A200 and high-grade Xilinx Virtex Ultrascale+VU19, with a multiplicative factor of 1.8× for our mid-grade MOCS and high-grade MOCS resource estimation. FIG. 14 is a table listing the resource utilization for several secure hashing algorithm (SHA) authentication modules variants as well as an AES-256 encryption module. Mid-grade modules occupied less than about 3%, while high-grade modules occupied less than 0.2%, illustrating both the ability of MOCS to facilitate immutable Root-of-Trust updates as well as the variance in design sizes that a user may choose to commit to OTP.

In embodiments, when equipped with a 1.2V source (or charge-pump), the FPGA 10 can perform the MTP-to-OTP conversion remotely without human intervention. An internet-enabled FPGA 10 can be configured to download, patch, and blow-in additional security features automatically, similarly to conventional or known software operating systems. This feature may prove patching capabilities should vulnerabilities be discovered in an FPGA-based root of trust.

Patching need not be a single-time event. Additional and supplemental patching is possible. Although described above in connection with authentication, updates to decryption functionality can be provided in a similar manner. Embodiments may also include public-key cryptography to perform authentication first. In embodiments, an authentication patch may be layered onto an authentication patch, e.g., Auth 3 is a patch for Auth 2.

While disclosed embodiments rely on converting the FPGA 10 MTP CLBs 14 and CIs 12 into OPT CLBs and CIs for Root-of-Trust updates, other embodiments include additional and/or alternative approaches. For example, embodiments may include dedicated hybrid MTP/OTP CLBs 14 and CIs 12 reserved specifically for Root-of-Trust updates. Embodiments may include a dedicated area of OTP-only CLBs 14 and CIs 12 that are reserved for Root-of-Trust updates.

In summary, disclosed is an FPGA architecture (MOCS) capable of performing immutable hardware Root-of-Trust patches. The architecture utilizes the dielectric breakdown mechanism of magneto tunnel junctions (MTJ) to operate both as: 1) multi-time programmable (MTP) configuration memory for reconfigurable FPGA designs, and 2) one-time programmable (OTP) memory for FPGA Root-of-Trust sections. The bitcell design and architecture has been demonstrated to facilitate customizable immutable Root-of-Trust patches with 3% overhead.

It is to be understood that the above description is intended to be illustrative, and not restrictive. Many other embodiments will be apparent to those of skill in the art upon reading and understanding the above description. It is contemplated that features described in association with one embodiment are optionally employed in addition or as an alternative to features described in or associated with another embodiment. The scope of the invention should, therefore, be determined with reference to the appended claims, along with the full scope of equivalents to which such claims are entitled.

What is claimed is:

1. A method for manufacturing and/or operating a field programmable gate array (FPGA) including programmable blocks (PBs), wherein the PBs include memory bitcells operable in a multi-time-programmable (MTP) mode and a one-time-programmable (OTP) mode, comprising:
   configuring the FPGA to perform a first Root-of-Trust (ROT) scheme utilizing first dedicated built-in circuitry and/or by configuring memory bitcells of a first group of PBs to operate in the OTP mode;
   receiving a first functional bitstream representative of a first functional operation for the FPGA;
   performing the first ROT scheme on the first functional bitstream using the first dedicated built-in circuitry and/or the memory bitcells of the first group of PBs;
   controlling the memory bitcells of a second group of PBs in the MTP mode to configure the memory bitcells of the second group of PBs for the first functional operation based on the first functional bitstream after performing the first ROT scheme on the first functional bitstream, wherein the memory bitcells of the second group of PBs is different than the first group of PBs;
   receiving a first update ROT bitstream representative of a first updated ROT scheme; and
   controlling the memory bitcells of a third group of PBs in the OTP mode to configure the memory bitcells of the third group of PBs to perform the first updated ROT scheme based on the first update ROT bitstream, wherein at least some of the memory bitcells of the third group of PBs is different than the memory bitcells of the first group of PBs.

2. The method of claim 1, wherein configuring the memory bitcells of the first group of PBs comprises:
   receiving a first ROT bitstream representative of the first ROT scheme; and
   controlling the memory bitcells of the first group of PBs in the OTP mode to configure the memory bitcells of the first group of PBs to perform the first ROT scheme.

3. The method of claim 1, further comprising:
   receiving a second functional bitstream representative of a second functional operation for the FPGA;
   performing the first updated ROT scheme on the second functional bitstream using the memory bitcells of the third group of PBs; and
   controlling the memory bitcells of a fourth group of PBs in the MTP mode to configure the memory bitcells of the fourth group of PBs for the second functional operation based on the second functional bitstream.

4. The method of claim 3, wherein at least some of the memory bitcells of the fourth group of PBs are different than the memory bitcells of the second group of memory bitcells.

5. The method of claim 4, wherein at least some of the memory bitcells of the fourth group of PBs are the same as the memory bitcells of the second group of memory bitcells.

6. The method of claim 3, wherein at least some of the memory bitcells of the fourth group of PBs are the same as the memory bitcells of the second group of memory bitcells.

7. The method of claim 3, further including: receiving a second update ROT bitstream representative of a second updated ROT scheme;
   controlling the memory bitcells of a fifth group of PBs in the OTP mode to configure the memory bitcells of the fifth group of PBs to perform the second updated security scheme based on the second ROT bitstream, wherein at least some of the memory bitcells of the fifth group of PBs is different than the memory bitcells of the first and third groups of PBs;
   receiving a third functional bitstream representative of a third functional operation for the FPGA;
   performing the second updated security scheme on the third functional bitstream using the memory bitcells of the fifth group of PBs; and
   controlling the memory bitcells of a sixth group of PBs in the MTP mode to configure the memory bitcells of the sixth group of PBs for the third functional operation after performing the second updated security scheme on the third functional bitstream.

8. The method of claim 7, wherein at least some of the memory bitcells of the sixth group of PBs are different than the memory bitcells of the second group of memory bitcells.

9. The method of claim 8, wherein at least some of the memory bitcells of the sixth group of PBs are the same as the memory bitcells of the second group of memory bitcells.

10. The method of claim 7, wherein at least some of the memory bitcells of the sixth group of PBs are the same as the memory bitcells of the second group of memory bitcells.

11. The method of claim 1 wherein the ROT scheme comprises one or more of an authentication scheme, a verification scheme, an encryption scheme, or a decryption scheme.

12. The method of claim 1 wherein the FPGA comprises one or both of configurable logic blocks or configurable interconnects.

13. A method for manufacturing and/or operating a field programmable gate array (FPGA) including programmable blocks (PBs), wherein the PBs include magnetic tunnel junction (MTJ) memory bitcells operable in a multi-time-programmable (MTP) mode and a one-time-programmable (OTP) mode, comprising:
configuring the FPGA to perform a first Root-of-Trust (ROT) scheme utilizing first dedicated built-in circuitry and/or by configuring MTJ memory bitcells of a first group of PBs to operate in the OTP mode;
receiving a first functional bitstream representative of a first functional operation for the FPGA;
performing the first ROT scheme on the first functional bitstream using the first dedicated built-in circuitry and/or the MTJ memory bitcells of the first group of PBs;
controlling the MTJ memory bitcells of a second group of PBs in the MTP mode to configure the MTJ memory bitcells of the second group of PBs for the first functional operation based on the first functional bitstream after performing the first ROT scheme on the first functional bitstream, wherein the MTJ memory bitcells of the second group of PBs is different than the first group of PBs;
receiving a first update ROT bitstream representative of a first updated ROT scheme; and
controlling the MTJ memory bitcells of a third group of PBs in the OTP mode to configure the MTJ memory bitcells of the third group of PBs to perform the first updated ROT scheme based on the first update ROT bitstream, wherein at least some of the MTJ memory bitcells of the third group of PBs is different than the memory bitcells of the first group of PBs.

14. The method of claim 13, wherein configuring the MTJ memory bitcells of the first group of PBs comprises:
receiving a first ROT bitstream representative of the first ROT scheme; and
controlling the MTJ memory bitcells of the first group of PBs in the OTP mode to configure the MTJ memory bitcells of the first group of PBs to perform the first ROT scheme.

15. The method of claim 13, further comprising:
receiving a second functional bitstream representative of a second functional operation for the FPGA;
performing the first updated ROT scheme on the second functional bitstream using the MTJ memory bitcells of the third group of PBs; and
controlling the MTJ memory bitcells of a fourth group of PBs in the MTP mode to configure the MTJ memory bitcells of the fourth group of PBs for the second functional operation based on the second functional bitstream.

16. The method of claim 15, wherein at least some of the MTJ memory bitcells of the fourth group of PBs are different than the MTJ memory bitcells of the second group of MTJ memory bitcells.

17. The method of claim 16, wherein at least some of the MTJ memory bitcells of the fourth group of PBs are the same as the MTJ memory bitcells of the second group of MTJ memory bitcells.

18. The method of claim 15, wherein at least some of the MTJ memory bitcells of the fourth group of PBs are the same as the MTJ memory bitcells of the second group of MTJ memory bitcells.

19. The method of claim 15, further including:
receiving a second update ROT bitstream representative of a second updated ROT scheme;
controlling the MTJ memory bitcells of a fifth group of PBs in the OTP mode to configure the MTJ memory bitcells of the fifth group of PBs to perform the second updated security scheme based on the second ROT bitstream, wherein at least some of the MTJ memory bitcells of the fifth group of PBs is different than the MTJ memory bitcells of the first and third groups of PBs;
receiving a third functional bitstream representative of a third functional operation for the FPGA;
performing the second updated security scheme on the third functional bitstream using the MTJ memory bitcells of the fifth group of PBs; and
controlling the MTJ memory bitcells of a sixth group of PBs in the MTP mode to configure the MTJ memory bitcells of the sixth group of PBs for the third functional operation after performing the second updated security scheme on the third functional bitstream.

20. The method of claim 19, wherein at least some of the MTJ memory bitcells of the sixth group of PBs are different than the MTJ memory bitcells of the second group of MTJ memory bitcells.

21. The method of claim 20, wherein at least some of the MTJ memory bitcells of the sixth group of PBs are the same as the MTJ memory bitcells of the second group of MTJ memory bitcells.

22. The method of claim 19, wherein at least some of the MTJ memory bitcells of the sixth group of PBs are the same as the MTJ memory bitcells of the second group of MTJ memory bitcells.

23. The method of claim 13 wherein the ROT scheme comprises one or more of an authentication scheme, a verification scheme, an encryption scheme, or a decryption scheme.

24. The method of claim 13 wherein the FPGA comprises one or both of configurable logic blocks or configurable interconnects.

* * * * *